United States Patent [19]

Kim et al.

[11] Patent Number: 5,376,859
[45] Date of Patent: Dec. 27, 1994

[54] TRANSDUCERS WITH IMPROVED SIGNAL TRANSFER

[75] Inventors: Chulho Kim, Burke; Manfred Kahn, Alexandria, both of Va.

[73] Assignee: The United States of America as represented by the Secretary of the Navy, Washington, D.C.

[21] Appl. No.: 193,688

[22] Filed: Feb. 7, 1994

[51] Int. Cl.⁵ .............................................. H01L 41/08
[52] U.S. Cl. ....................................... 310/334; 310/358
[58] Field of Search ............................. 310/357-359, 310/334-337

[56] References Cited

U.S. PATENT DOCUMENTS

| | | | |
|---|---|---|---|
| 4,422,003 | 12/1983 | Safari et al. | 310/358 |
| 4,801,835 | 1/1989 | Nakaya et al. | 310/358 |
| 4,876,776 | 10/1989 | Whatmore et al. | 310/358 X |
| 5,142,187 | 8/1992 | Saito et al. | 310/358 |
| 5,191,796 | 3/1993 | Kishi et al. | 310/358 X |

Primary Examiner—Mark O. Budd
Attorney, Agent, or Firm—Thomas E. McDonnell; George A. Kap

[57] ABSTRACT

A transducer includes a rigid resin in the form of a solid block; a plurality of spaced and parallel piezoelectric rods of equal length disposed in the rigid resin and extending at one end thereof beyond the rigid resin; a solid soft resin enveloping the rods; and electrically conducting cover plates disposed against extremities of the rods; the rigid resin block being composed of a plurality of stacked preforms having spaced and parallel upper grooves wherein the rods are disposed. The process for making transducers with extended piezoelectric rods includes the steps of loading the rods into a plurality of spaced and parallel upper grooves of preforms made from a rigid resin; stacking the loaded preforms one on top of another to the desired height, the rods being flush with the preforms at one end and extending beyond the preforms at the other end; infiltrating a soft resin around the rods; curing the soft resin to a solid, compressible state; and applying electrically conducting cover plates against the rod ends.

11 Claims, 2 Drawing Sheets

TRANSDUCERS WITH IMPROVED SIGNAL TRANSFER

FIELD OF THE INVENTION

This invention pertains to the field of transducers and more specifically, to transducers having improved signal transfer and to processes for making such transducers.

BACKGROUND OF THE INVENTION

Transducers transform one form of energy into another and can be characterized, for purposes herein, by a plurality of spaced, parallel transducer rods made of a piezoelectric material embedded in a rigid resin between a pair spaced, electrically conducting layers or plates disposed transversely to the rods. The rods can be considered to be disposed in the vertical Z direction and the conducting plates can be considered to be disposed in the transverse X,Y plane. In order to improve the sensitivity of the transducers, an air cylinder or a layer of a soft resin is provided around the transducer rods. Provision of air or soft resin around the rods attenuates lateral acoustic pressure fluctuations and results in an improved hydrostatic performance of the transducers.

One problem encountered in transducers is the inefficient transfer of a force between the cover plates and the transducer rods. In prior art transducers, when a force is imparted to a cover plate, only a fraction of that force is transmitted by the cover plate to the transducer rods and the rest of that force is transmitted by the cover plate to the matrix surrounding the rods. The matrix includes the rigid resin and the cylinder of air or soft resin around the rods. Most of the force transferred to the matrix is lost since the matrix is an inactive part of the transducer. The loss of the force fraction transmitted to the matrix means that the rods, which are the only active element in the transducer, do not receive and do not convert the full force imparted to the cover plate with the result that performance of the transducer is reduced.

The loss of force to the matrix is exacerbated in transducers that have a soft resin around the transducer rods. Since the soft resin is resilient and compressible, it is quite difficult to grind the soft resin to the level of the rods or to that of the rigid matrix and the result is bulging of the soft resin above the level of the rods or the rigid matrix. Consequently, only a small fraction of the applied force is transfessed to the active rods.

SUMMARY OF THE INVENTION

An object of this invention is a transducer which has enhanced performance.

Another object of this invention is a transducer which has improved force transfer between the cover plates and the transducer rods.

Another object of this invention is a method of making transducers which have enhanced performance.

Another object of this invention is a method for making transducers which have an improved force transfer between the cover plates and the transducer rods.

The transducer of this invention comprises a solid rigid resin; a plurality of spaced and parallel piezoelectric rods of equal length disposed in, and extending beyond, the rigid resin at least at one end of the rods; a solid soft resin disposed around the rods in the rigid resin; and cover plates disposed against both ends of the rods, with the rigid and soft resins disposed between the cover plates. The process for making the transducers comprises the steps of loading the rods into preforms made from the rigid resin; placing and securing a plurality of the loaded preforms one on top of another to the desired height, the rods extending beyond the preforms at least at one end of the rods and the preforms forming a block of the rigid resin; providing a soft resin in solid form around the rods; and applying cover plates against both ends of the rods.

DETAILED DESCRIPTION OF INVENTION

Figure 1:
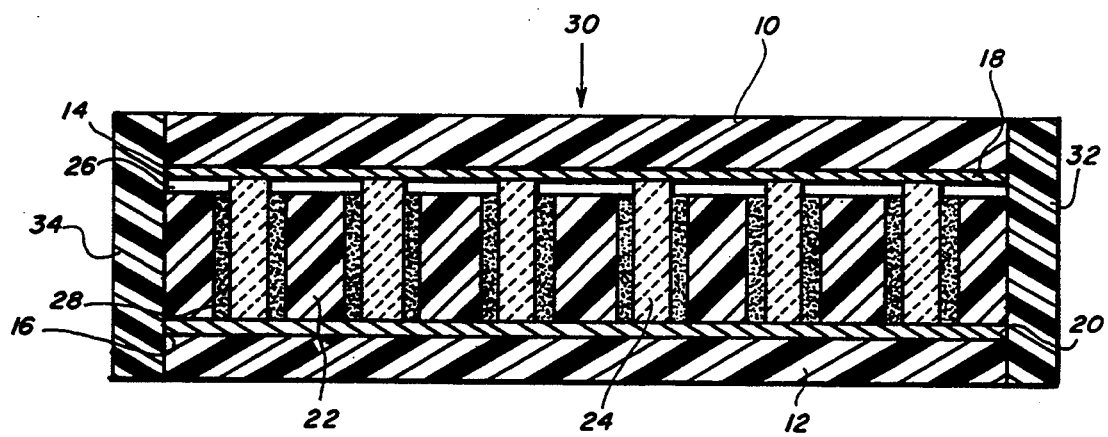
FIG. 1 is a cross-sectional view of a transducer with extended piezoelectric rods and an air gap between the upper cover plate and the matrix.

This invention is directed to transducers which have improved force transfer between the cover plates and the transducer rods embedded in a rigid resin that can be composed of a plurality of preforms wherein the rods extend beyond the preforms. Also, this invention is directed to processes for making transducers which have improved force transfer between the cover plates and the transducer rods wherein the transducer rods extend beyond the preforms.

Transducers of this invention are intended to be used as receivers or drivers in the frequency range of 1–1000 Hz. The transducers of this invention are especially suited for use as receivers of underwater sound signals to sense the presence of another vessel or of an echo. These latter functions are typically carried out in the frequency range of 10–800 Hz.

Improved performance of transducers can be attained when the piezoelectric rods extend above and beyond the upper surface of the matrix and contact the cover plates. Transducers with extended rods are characterized by a space between the matrix and the cover plates and any force imparted to the cover plates is transmitted to the rods without any portion of the force being transmitted to the preforms.

As with the prior art transducers, transducers with extended rods have a plurality of vertically spaced, parallel rods made of a piezoelectric material, embedded in a rigid resin between a pair of spaced, electrically conducting plates. The cover plates are disposed transversely to the vertically disposed rods. The cover plates can be made of an electrically conducting material or they can be made of a non-conducting material coated with a conducting layer to either transmit an electrical signal to the rods or to receive an electrical signal from the rods. An electrically conducting paste can be laid on the cover plates to provide adhesion between the cover plates and the rods.

Unlike prior art transducers, transducers with the extended rods have spaces or gaps between the cover plates and the preforms. The gaps are of sufficient extent to prevent any force exerted on the cover plates to be transmitted to the matrix. The gaps, which are under vacuum or contain a gas such as air in one embodiment of the transducers, can be at both ends of the rods or only at one end. The gap at one or both ends of the rods is in excess of about 50 microns, preferably 300–1000 microns.

In another embodiment of the transducers characterized by extended rods, the cover plates are spaced from the preforms forming a gap between the cover plates and the preforms with a soft resin disposed in the gap. Since the soft resin is pliable and compressible in its cured state, transfer of any force from the cover plates to the soft resin is minimal and the sensitivity of transducers containing the soft resin in the gap between the cover plates and the preforms is not substantially reduced.

The transducer rods are often circular in cross-section although other shapes can be used. In a typical embodiment, the transducer rods are circular in cross-section with a diameter of about 0.005–1 cm, typically about 0.01–0.5 cm. If the rods are too thick, the matrix becomes unnecessary because thick rods do not need the external support provided by the matrix. If the rods are too thin, they are difficult to manufacture and assemble and they break readily. The length of the transducer rods depends on the desired characteristics. In the present invention, the transducer rods will be slightly longer than the length or extent of the matrix. The length of the transducer rods is typically about 0.01–5 cm, most often about 0.05–1 cm. If the rods are too long, poling will be a problem and if the rods are too short, inadequate electrical signals will be generated.

The transducer rods are made from a suitable sintered piezoelectric or electrostrictive ceramic. The transducer rods are typically made from PZT (lead-zirconium-titanate) or any other piezoelectric or electrostrictive material having a strain coefficient of at least about $10 \times 10^{-12}$ m/volt. Piezoceramic and electrostrictive materials are commercially available.

The rigid resin is a non-compressible thermoplastic with a modulus of elasticity of typically about 300 to about 50,000 MPa, more often 500 to 20,000 MPa. In a preferred embodiment, the rigid resin is selected from fiber-reinforced resins such as polyphthalamide or polycarbonate resins.

The rigid resin can be cast in the form of a block or in the form of preforms having an upper surface and a lower surface. The upper surface is provided with a plurality of equally spaced upper grooves and the lower surface is provided with a plurality of equally spaced lower grooves. The transducer rods are positioned in the upper grooves. A plurality of the preforms are assembled by stacking one on top of another so that the grooves in the upper and lower surfaces of adjoining preforms are in registry and form pockets within which the rods reside. The preforms can be adhesively secured together. Each preform typically has 2–500, and most often 5–100 upper and lower grooves and each upper groove should hold a single rod and a layer of the soft resin around the rod, if the soft resin is used.

A stack of preforms consists of a plurality of intermediate preforms, a top preform, and a bottom preform. Intermediate preforms are preferably identical except that alternate intermediate preforms are turned 180 degrees about the vertical axis from the other intermediate preforms. The top preform of a transducer is of similar and typically of the same thickness as the intermediate preforms but with an upper flat surface which is devoid of upper grooves and has only a plurality of spaced lower grooves along its lower surface. The lower grooves in the top preform typically have about the same dimensions as in the intermediate preforms.

The bottom preform of a transducer is of similar and typically of the same thickness as the intermediate preforms but with a flat lower surface which is devoid of lower grooves and has only a plurality of spaced upper grooves along its upper surface. The upper grooves in the bottom preform typically have the same dimensions as in the intermediate preforms.

The dimensions of a preform are dictated, inter alia, by the number of transducer rods the preform is to accommodate, the stiffness of the resin from which it is made, and other factors. Based on practical considerations, however, the width, length and thickness dimensions of each preform are typically about 0.1–100 cm, and more typically about 0.5–25 cm; typically about 0.01–50 cm, and more typically about 0.05‘20 cm; and typically about 0.01–2 cm, and more typically about 0.05–1.0 cm.

The soft resin surrounding the transducer rods should be soft and compressible its cured or set form, so that it can reduce the lateral effects of hydrostatic pressure fluctuations exerted on the transducers of this invention. The soft resin around the rods is typically in the form of a relatively thin layer. The thickness of the soft resin layer depends on many factors, but, typically, it should be thicker than about 100 microns, most often 200 to 500 microns in thickness. The modulus of elasticity of the soft resin is typically 0.1–200 MPa and more typically in the range of 0.5–10 MPa. For example, the soft resin is a soft epoxy such as the following resins which are commercially available under the trade names RHO-C 35065, HD-50, HD-68, HD-77, and EN-2.

The soft resin that is suitable herein is compressible. The soft non-compressible resin does not change volume when compressed and has a high Poisson's ratio whereas the soft compressible resin changes volume when compressed by applied hydrostatic pressure and has a low Poisson's ratio—of as much as about one-half of the soft non-compressible resin. The soft compressible resin may be made, for example, by incorporating hollow, compressible plastic spheres into the soft non-compressible resin such as RHO-C 35065 resin, HD-50 resin, HD-68 resin, HD-77 resin or EN-2 resin. Typically, up to about 50% of the volume of the resin can be the hollow spheres, more often about 10–40%.

The significance of the difference between the soft resins becomes noticeable when hydrostatic pressure is applied to a transducer having rods enveloped in a soft resin. As expected, the transducer with rods coated with a compressible soft resin will attenuate the lateral component of the applied hydrostatic pressure whereas rods coated with a non-compressible soft resin will not. This also means that the hydrostatic charge coefficient ($d_h$) for the transducer with the compressible soft resin coating the rods will be higher than for a comparable transducer with a non-compressible soft resin coating the rods.

Patent application Ser. No. 08/076,135 entitled "Transducers And Method For Making Same" filed in the U.S. Patent and Trademark Office on Jun. 9, 1993, on behalf of inventors Kahn and Kim discloses transducers comprising preforms made from the rigid resin, PZT rods disposed in the preforms, a compressible soft resin enveloping the rods, and cover plates disposed at both ends of the rods. The entirety of the Ser. No. 08/076,135 patent application is incorporated herein by reference for all purposes.

The ratio of the volume of the piezoelectric transducer rods to that of the soft resin and to that of the rigid resin should be selected to benefit from the advantage provided by the improved performance of the transducers. Without the cover plates, the volume percent of the piezoelectric ceramic is typically 5-30% in a transducer assembly, and most often in the approximate range of about 10-20%; and the amount of the soft resin is typically 5-50%, and most often in the approximate range of 10-30%. The remainder is the rigid, stiff resin.

Figure 3:
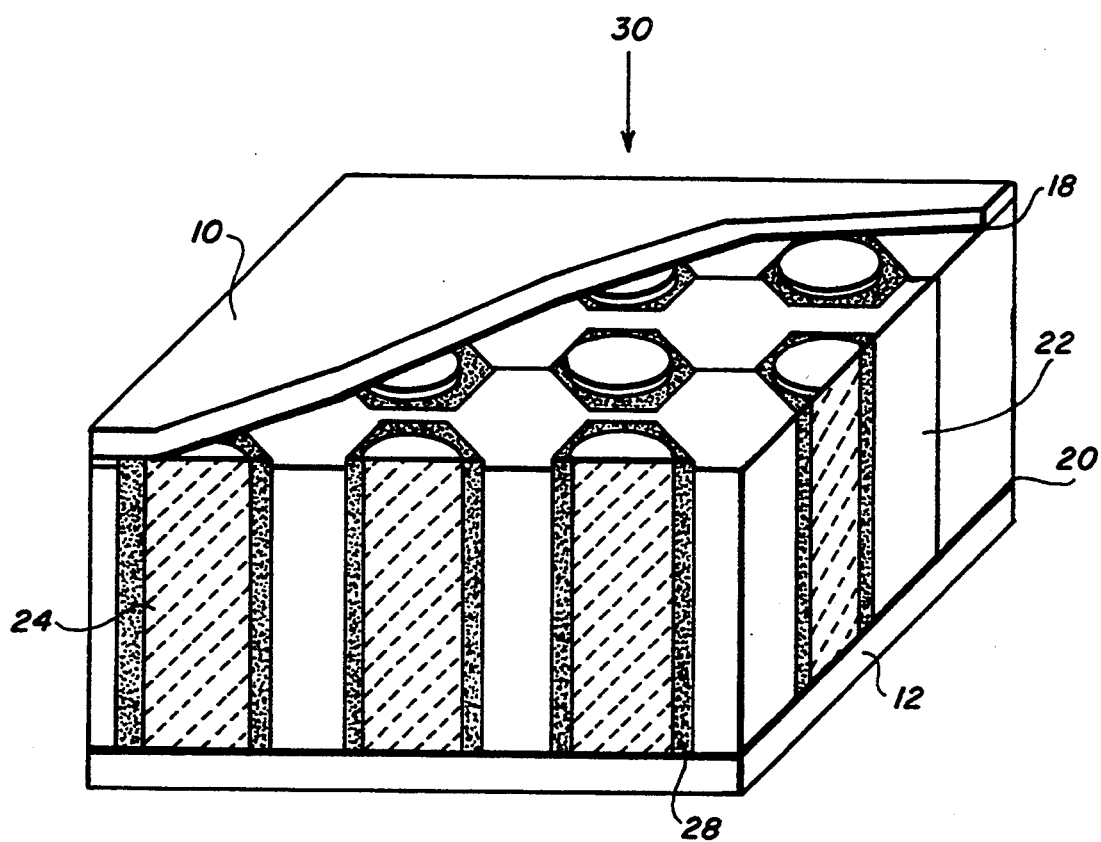
FIG. 3 is a perspective view of a transducer with extended piezoelectric rods.

A specific embodiment of the extended rod transducers is illustrated in FIGS. 1 and 3 where the gap between the upper cover plate and the preforms spaced below the cover plate is devoid of the soft resin and contains only air. Upper and lower cover plates 10, 12 are disposed horizontally in a spaced relationship in the X-Y plane. The cover plates are fiber-filled epoxy boards with a coating of copper 14 on the top surface of the upper cover plate 10 and a similar coating of copper 16 on the bottom surface of the lower cover plate 12.

A layer of silver epoxy paste 18 is provided on the copper coating 14 of upper cover plate 10 facing the matrix and a layer of silver epoxy paste 20 is provided on copper coating 16 of lower cover plate 12 also facing the matrix. The paste is electrically conducting and is used for adhering the contacting components together.

Disposed between the cover plates are the plastic matrix and the piezoelectric rods. The matrix is composed of solid rigid resin 22 and solid soft resin 28. The piezoelectric rods 24 are vertically disposed along the Z axis and extend between the spaced, transverse cover plates, contacting paste layer 18 at the upper end of each rod and paste layer 20 at the lower end of each rod and matrix. The spaced cover plates are disposed transversely to the longitudinal axis of the rods. An air gap 26 serves to separate the matrix from paste layer 18.

The soft resin is disposed around the rods in order to reduce the pressure on the rods in the X-Y plane. The soft resin, which is in a form of a layer 28 around the rods, is part of the matrix and extends to the level of the rigid resin in the matrix, as shown in FIG. 1. Edge strips 32 and 34 are provided on the right and left side of the transducer and confine the components thereof from the sides. Additional edge strips can be provided as needed.

When a force 30 is exerted on the transducer shown in FIG. 1, the extension of the rods above the matrix, and the presence of gap 26 assures that all of the force is transmitted to the rods othe than to the matrix.

FIG. 3 is a perspective view of the transducer of FIG. 1, without the edge strips, and the same reference numerals are used to denote the same parts.

Figure 2:
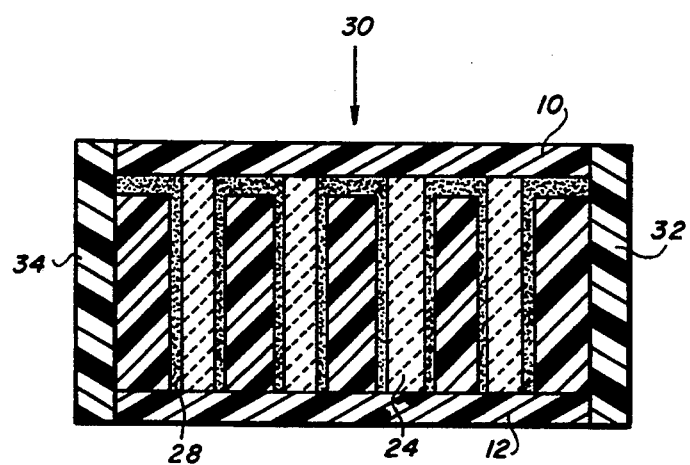
FIG. 2 is a cross-sectional view of a transducer with extended piezoelectric rods and a soft resin in the gap between the upper cover plate and the preforms which form a rectangular block.

Since the soft resin around and over the rods is compressible, sensitivity of a the transducer is not significantly affected even where the soft resin contacts the upper cover plate, as illustrated in FIG. 2, where the reference numerals are the same as those in FIG. 1 and designate the same parts. The difference between the embodiments of FIG. 1 and 2 resides in the gap between the upper cover plate and the matrix: whereas the embodiment of FIG. 1 has air in the gap, the embodiment of FIG. 2 has the soft resin 29 in the gap.

The transducers with projecting rods and the gap between the upper cover plate and the matrix, an embodiment which is illustrated in FIG. 1, can be made by initially selecting appropriate materials, which include piezoelectric rods of equal length, preforms made from the rigid resin and being of equal length with the equally spaced upper grooves in upper surface and with the equally spaced lower grooves in lower surface of each preform, the soft resin which can be heated to reduce its viscosity, and the cover plates which can be of an electrically conducting metal or of an electrically non-conducting plastic with an electrically conducting coating thereon. The length of the rods exceeds the length of the rigid resin block or preforms made from the rigid resin.

The assembly process includes the step of loading the rods generally horizontally into the upper grooves of the preforms. This step can be manual or it can be automated whereby one rod is placed automatically into each upper groove of each preform. This automated step can be accomplished by placing a bundle of loose rods of equal length into a dispensing unit provided with an exit aperture. The preforms are aligned one after another under the exit aperture and the dispensing unit is gently vibrated to deposit one rod into each upper groove as preforms are moved under the exit aperture relative to the dispensing unit.

Thus, the rods are placed laterally in each upper groove of each preform. The upper grooves, which typically have divergent or inclined sidewalls, facilitate rapid automatic location of the rods in the preforms.

After the rods are loaded into the preforms, the preforms are stacked one on top of another to the desired height. In the stacked position, the rods are disposed in pockets formed by cooperating upper and lower grooves of adjoining preforms in the stack. The stacking operation may be, for example, carried out in a frame consisting of five removable plates with flat inner surfaces and with one open top. The preforms are stacked with the upper grooves and rods therein lying generally in a horizontal or an inclined plane. A plurality of preforms are stacked with a plurality of intermediate preforms between the top and bottom preforms of the stack. The rods are longer than the grooves so that the rods extend beyond the grooves at one or at both ends thereof.

In order to have the rods flush with the grooves at one end and extending beyond the grooves at the opposite end, the stack is placed on its side in the same or different frame so that the rods extend generally vertically, the lower ends of the rods being flush with the grooves with the upper ends of the rods extending above the grooves at the upper end of the stack. The rods are loosely disposed in the pockets so that gravity makes their lower ends flush with the grooves. If for some reason, the lower end of a rod is not flush with the grooves, the rod may be pushed in so that it is flush.

There are a number of different procedures of providing the soft resin in the cavities around the rods disposed in the pockets. Pursuant to one procedure, the soft resin, in liquid form, is infiltrated around the rods of a stack by flowing it over the rods and placing the stack into a vacuum chamber that is then maintained at a pressure of less than about 1 mm of mercury, preferably $10^{-6}$ to $10^{-3}$ Torr, for a period of about 2-15 minutes. By subjecting the stack to vacuum, air from the soft resin and from the cavities around the rods is removed, allowing the soft resin to flow downwardly into the pockets around the rods and in most cases to space the rods away from direct wall contact points in the pockets. Resin flow around the rods is facilitated by heating the soft resin to lower its viscosity. After infiltration, the excess soft resin is removed by removing one of the side plates and brushing-off the excess soft resin. With the excess soft resin removed, the upper end of remaining soft resin is generally flush with the grooves. The side plate is then replaced for the curing cycle.

When it is desired to deposit the soft resin over the rod extensions, longer frame side plates are used so that the removable side plates of the frame extend above the rod extensions and more soft resin is deposited than is needed to infiltrate around the rods. The excess soft resin is then removed leaving it extending to the upper level of the rods.

Once the soft resin is deposited in the pockets around the rods, it can be cured at about room temperature or at an elevated temperature that will not damage the preforms or the rods. Curing can be accomplished by any suitable means. For example, the soft resin can be cured at room temperature overnight or it can be cured by heating in an oven. Typically, the soft resin is cured to a soft, pliable solid state at a temperature from near room temperature to about 70° C. in a period of about 1 hour to 15 hours.

After the soft resin is cured around the rods, the stack is a solid item with rods flush, at one end, with the grooves and extending beyond the grooves at their opposite ends. The matrix consists of the hard resin or the preforms made from the hard resin and the soft resin. At this point, the stack is removed from the frame by removing the four side plates and the bottom plate, and the stack is typically ground at both rod ends to assure that it is flat or planar. Then, the cover plates are applied at both ends of the stack abutting against the rod ends.

Grinding may be carried by any conventional means. For example, grinding may be performed on a rotating wheel having a flat, rigid surface having thereon a fine sandpaper, preferably silicon carbide sandpaper. Typically, the fineness of the sandpaper is about 320 to about 600 mesh with grit size of about 16 to about 36 microns. Grinding is normally continued until the rod ends are flat and parallel.

When both ends of the stack have been ground, cover plates are applied at both ends of the rods. The cover plates can be made of an electrically conducting metal or a non-conducting material coated with an electrically conducting coating, such as a thin copper coating or cladding applied by vapor deposition or by lamination.

In order to promote adhesion between the cover plates and the stack, the cover plates can be provided with a layer of an electrically conducting paste, such as a silver epoxy paste. The paste can be applied on one face of a cover plate through a fine screen. The thickness of the paste on the cover plates is typically about 50 to about 1000 microns, and more often about 100 to about 500 microns. The paste faces of the cover plates are then applied to the rod ends at both ends of the stack.

The method of poling the transducer rods is not critical. Thus, any technique suitable for poling piezoelectric ceramics may be used. The rods can be poled before or after they are assembled into the stack.

A plurality of stacks can be assembled side by side with a nonconductive adhesive to form a transducer array of desired size. Such an array can be mounted on the hull of a vessel with provision being made for waterproofing the array. An electrical lead, or several of such leads, can be attached to each conducting surface to provide a driving voltage in a transmitting mode or to receive signals from a transducer array which signals are then processed in a known way.

If it is desired to make a transducer with extended rods at both ends thereof with air or another gas in the gap between the cover plates and the preforms, the process for making it slightly differs from the process for making a transducer with extended rods at only one end thereof.

A transducer with extended rods at both ends can be made by assembling vertically in a frame the preforms made from the rigid resin so that the upper grooves from one preform register with the lower grooves of the adjoining preform to form elongated pockets for the rods. The preforms are of equal length. The assembled preforms are then placed on a level surface of a solidified wax. Solid spacers that are of the same thickness as the wax are placed on both edges of the wax to support the preforms at certain height. For this disposition, the preforms can be clamped to keep them together and in proper alignment. In this position, the pockets are vertically disposed. The solid wax is disposed on a flat surface and thickness of the wax is slightly thinner than the space desired between the cover plate and the matrix.

The rods are then inserted into the vertically disposed pockets and pushed inwardly until the lower ends of the rods abut the solidified wax and are level with the lower ends of the grooves. Since the rods are longer than the grooves, the rods extend beyond and above the upper ends of the grooves, which are opposite to the lower end which contacts the solidified wax. The wax is then melted. With the wax in the molten state, the rods are pushed further inwardly until the lower ends thereof abut the flat surface on which the molten wax is disposed. At this point, the preforms are resting on the spacers and the extended rod ends are disposed within the molten wax to the extent of the gap between the preforms and the cover plate. The wax is then solidified which blocks entry of the soft resin into the pockets from below at the lower end of the rods.

Although any wax can be used herein, for convenience, the wax desirably has a melting temperature above room temperature so that it can be melted by heating above room temperature and can be soldified by exposing it to room temperature. One especially suitable wax for purposes herein is wax known as the Apiezon wax, which softens at 85° C.

The next step in the process involves flowing the soft resin from the top and around the rods disposed in the pockets of the preforms, with the preforms disposed generally vertically in a frame composed of removable flat plates. The frame has an open upper end and the side plates of the frame extend above the extending rods. Excess soft resin is removed by removing one of the side plates and removing, for example, by brushing, any resin that extends above the grooves on the side from which the side plate was removed. After excess soft resin is removed and the side plate is replaced, the remaining soft resin is cured, i.e., overnight at room temperature, to a solid, pliable or flexible state.

The stack is removed from the frame after the soft resin cure and the wax around the extending lower ends is removed by heating the wax above its melting temperature and cleaning the residual wax with a suitable solvent such as the Fisher wax-out solution. After the wax is removed, one obtains a stack of preforms with the rods passing through the stack and extending beyond the stack at both ends thereof, and the soft resin in a cured state around the rods and being longitudinally coextensive with the stack of the preforms.

After removal of the wax, both extending ends of the rods may be ground, typically with a silicon carbide sandpaper on a rotating wheel, to remove any debris from the rod ends and to grind the rod ends flat. After the grinding operation, the cover plates are applied to the extending rod ends. What results is a transducer with air gaps between the cover plates and the matrix at both ends of the rods with the rod ends contacting the cover plates at both ends thereof. The rods may be poled in a known and convenient manner.

A transducer with the soft resin in the gap between the upper cover plate and the preforms can be made by a process which involves cutting of the cured, soft resin. This embodiment is illustrated in FIG. 2 where the same reference numerals denote the same parts as in the embodiment illustrated in FIG. 1.

The transducer with extended rods at one end with the soft resin in the gap between the upper cover plate and the preforms can be made by loading the rods into the equally spaced upper grooves of the preforms and then stacking the loaded preforms to the desired height to form a stack. The equal sized rods are longer than the equal sized preforms and extend beyond at least one end of the grooves in the preforms. The preforms are stacked horizontally in a frame with the rods disposed in the pockets formed by the cooperating upper and lower grooves of adjacent preforms, which grooves extend transversely to the long side of the preforms. The stack is then removed from the frame and placed into another frame with the rods disposed generally in the vertical plane, with the lower lower ends of the grooves.

Once the stack is disposed in a frame with rods extending generally vertically, the soft resin is infiltrated around and above the rods. At this point, the soft resin is cured to a solid, pliable state and protrudes above the extending rod ends at the upper ends of the rods. The stack is then removed from the frame, excess cured resin protruding above the extending rod ends is cut away, the stack at both rod ends is ground, and cover plates are applied at both ends of the rods. The result is a transducer illustrated In FIG. 2 which is characterized by the soft resin disposed in the gap between the upper cover plate and the preforms.

It may be desired to have protruding rods at both ends of a transducer with a gap between the upper and lower cover plates and the preforms filled with the soft resin. In this embodiment, loaded preforms are stacked in a frame to the desired height with the rods extending at both ends beyond the preforms. The soft resin is provided around and above the rods at both ends thereof and cured. The excess soft resin protruding above rod ends at both ends of the rods is cut away. In the embodiment where the soft resin is disposed around the rods and the rods extend beyond the preforms at both ends thereof, provision of cover plates against the protruding rods results in a gap filled with the soft resin at both ends of such transducers.

The advantages of this invention reside in the amplification of the uniformly distributed pressure in the external medium to a multiple of this value when applied to the ceramic rods. This is because the force from the pressure on the whole plate surface is applied to the rods only, giving a higher pressure there. Since the cross sectional area of the rods may only constitute about 15% of the total area, the sensitivity of a transducer when used a hydrophone is raised nearly seven times. When used with a layer of the soft resin around the rods as an actuator, the space created between the matrix and the cover plate provides for positive decoupling of the cover plates from the matrix, thereby also permitting higher driving amplitudes.

The invention having been generally described, the following examples are given as particular embodiments of the invention to demonstrate the practice and advantages thereof. It is understood that the examples are given by way of illustration and are not intended to limit in any manner the specification or the claims that follow.

EXAMPLE 1

This example demonstrates the extended rod transducer of FIGS. 1 and 3.

The preforms were injection molded from a stiff polycarbonate resin and had a Young's Modulus of 2400 MPa and Poisson's ratio of 0.39. Each preform measured 2.0 cm×0.16 cm×0.56 cm. Ten preforms were stacked one on top of another in forming the transducer element. Extending from upper and lower surfaces of each preform were 10 equally spaced, equal-sized upper and 10 equally spaced, equal-sized lower grooves. The depth of each upper groove was 0.08 cm and the depth of each lower groove was 0.04 cm. The side walls of the upper and lower grooves were inclined.

The transducer rods were circular in cross-section, made of a piezoelectric ceramic material known as PZT-5H, had a diameter of 0.8 cm and were 0.7 cm in length. The sintered rods were loaded into the preforms and the preforms were then assembled into a transducer element, but without the soft resin.

The transducer element was then vacuum infiltrated with a soft epoxy resin RHO-C 35065 having a Young's Modulus of 2.33 MPa and a Poisson's ratio of 0.49.

At this point, the transducer element consisted of one top preform, one bottom preform, eight intermediate preforms, the rods and the soft resin around the rods.

The transducer element described above was composed of, on a volume percent basis, 15.6% PZT rod material, 16.2% soft epoxy resin, 58.9% polycarbonate preforms and the air gap of 9.3%, without the cover plates. It had a hydrostatic stress coefficient ($d_h$) of 135 pC/N at ambient temperature.

The cover plates were then applied over both ends of the rods to interconnect the rods at both the upper and the lower portions thereof to form a transducer unit. The cover plates were rectangular, fiber-filled epoxy boards measuring 2.0 cm×1.6 cm with a thickness of about 0.7878 mm. Each cover plate had a copper coating 0.0686 mm thick on all its sides which coating functioned as an electrode. On each cover plate on the side coming in contact with the rods, there was a layer of silver epoxy paste about 0.3 mm in thickness. This layer of silver epoxy paste contacted ends of the rods and provided adhesion between the rods and the upper cover plate at the upper end of the transducer and provided adhesion between the lower cover plate and the rods, the soft resin, and the rigid resin at the lower end. External leads can be connected to the copper coating on each cover plate.

The transducer with extended rods and cover plates described above corresponds to the transducer illustrated in FIG. 1 wherein the air gap thickness between the silver epoxy paste and the matrix was 0.7 mm and thickness of the matrix was 0.56 cm. It had a $d_h$ of 288 pC/N at 23° C., 1 KHz and 2 MPa.

EXAMPLE 2

This example demonstrates a process for making the transducer of Example 1.

The process was commenced by loading the transducer rods into the upper grooves of the preforms made from a polycarbonate resin. Each preform was 2.0 cm long with transverse upper and lower grooves coextensive therewith. Each preform was 0.63 cm in width, and 0.16 mm in thickness. There were 10 equally spaced upper and 10 equally spaced lower grooves in each preform. Nine loaded preforms and one top preform were horizontally stacked in a frame. The frame was then turned to a position where the rods were disposed vertically. The rods were flush with the lower ends of the preforms and extended beyond the upper ends of the preforms. When the rods were disposed vertically, the frame consisted of five removable plate-like pieces with an open top. Soft, liquid epoxy resin was poured through the open upper end of the frame onto the extended rods until it enveloped the rods.

The transducer assembly in the frame was then placed in a vacuum chamber maintained by a mechanical pump at a vacuum of $10^{-3}$ Torr in order to remove entrapped air from the pockets formed by cooperative upper and lower grooves in adjoining preforms, in which pockets the rods were disposed. As soon as the entrapped air was removed, the space around the rods was infiltrated with the excess of the soft resin extending above the preforms. After infiltration, the frame with the transducer assembly was removed from the vacuum chamber. The excess soft resin, which was still uncured, was removed by removing one of the plates of the frame and brushing off excess soft resin so that the soft resin was flush with the top preform. The plate was replaced and the soft resin around the rods was cured overnight at room temperature to a soft and pliable solid state.

The transducer assembly with the cured soft resin around the rods was removed from the frame and both ends of the assembly were ground with a silicon carbide sandpaper to obtain level surfaces so that the cover plates could be attached thereto. The transducer assembly was completed by applying cover plates to the ends of the rods.

Each cover plate had a thin layer of copper on all its surfaces and a layer of a silver epoxy paste only on the surface contacting the transducer assembly. The copper coating was applied by lamination whereas the paste was applied manually to obtain uniform thickness of the paste on the copper coating. The paste was applied by placing a screen on the copper coating of the cover plate, scraping the paste against the screen to deposit the paste on the copper coating and then leveling the paste.

The transducer described above is characterized by an air gap between the upper cover plate and the stiff resin which allows transfer of force between the cover plates and the rods without transferring any force between the cover plates and the matrix, the matrix consisting of the stiff resin from which the preforms are made and the soft resin around the rods.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A transducer comprising a rigid resin having Young's Modulus of Elasticity from about 300 to about 50,000 MPa; a plurality of spaced parallel rods of equal length having at least upper or lower ends at extremities thereof disposed beyond said rigid resin; soft resin having a Young's Modulus of Elasticity from about 0.1 to about 200 MPa around said rods; upper and lower cover plates disposed transversely to said rods, said upper cover plate disposed against said upper ends of said rods and said lower cover plate disposed against said lower ends of said rods whereby at least one of said cover plates are spaced from said rigid resin thus preventing electrical contact between at least one of said cover plates and said rigid resin and creating a gap therebetween.

2. The transducer of claim 1 wherein said rigid resin is an electrically nonconductive thermoplastic resin with a Young's Modulus of Elasticity of about 500–20,000 MPa; said soft resin is an electrically nonconducting thermoplastic resin with a Young's Modulus of Elasticity of about 0.5–10 MPa; said rods comprise PZT; and said rods extend beyond said rigid resin at said upper ends of said rods and are flush with said rigid resin at said lower ends of said rods.

3. The transducer of claim 1 containing air in said gap between said upper cover plate and said rigid resin.

4. The transducer of claim 2 wherein said rigid resin is in the form of preforms having upper and lower surfaces that are provided with a plurality of spaced upper grooves in said upper surfaces and lower grooves in said lower surfaces; said preforms are disposed transversely to said rods; and said rods are enveloped in said soft resin and are disposed in pockets formed by said upper and said lower grooves of adjacent preforms.

5. The transducer of claim 2 wherein said soft resin is disposed in said gap between said upper cover plate and said rigid resin.

6. The transducer of claim 2 wherein said rigid resin is a polycarbonate resin; and said soft resin is an epoxy resin including 10 to 40 volume percent spheres.

7. A transducer comprising a rigid resin in the form of a block, said rigid resin having a Young's modulus of about 300–50,000 MPa; a plurality of spaced parallel rods of equal length having upper and lower ends at extremities thereof disposed in said rigid resin and extending beyond said rigid resin at upper ends of said rods; a soft resin having a Young's modulus of about 0.1–200 MPa around said rods; and upper and lower cover plates disposed transversely to said rods, said upper cover plate being disposed on said upper ends of said rods and spaced above said rigid resin by the distance said rods extend beyond said rigid resin, and said lower cover plate being disposed at said lower ends of said rods.

8. The transducer of claim 7 wherein said rigid resin is in the form of preforms having upper and lower surfaces that are provided with a plurality of spaced upper grooves in said upper surfaces and lower grooves in said lower surfaces; said preforms are disposed transversely to said rods; and said rods are enveloped in said soft resin and are disposed in pockets formed by the engagement of said upper and said lower gooves of adjacent preforms.

9. The transducer of claim 8 wherein said rigid resin is an electrically nonconductive thermoplastic resin with a Young's modulus of about 500–20,000 MPa; said soft resin is an electrically nonconducting thermoplastic resin with a Young's modulus of about 0.5–10 MPa; said rods comprise PZT; and said rods extend beyond said rigid resin at said upper ends of said rods and are flush with said rigid resin at said lower ends of said rods.

10. The transducer of claim 9 wherein said rigid resin is a polycarbonate resin; and said soft resin is an epoxy resin including 10 to 40 volume percent compressible spheres.

11. The transducer of claim 9 wherein said soft resin is disposed between said upper cover plate and said rigid resin.

* * * * *